United States Patent

[11] 3,581,223

[72] Inventor Merritt S. Armstrong
San Francisco, Calif.
[21] Appl. No. 820,542
[22] Filed Apr. 30, 1969
[45] Patented May 25, 1971
[73] Assignee HC Electronics, Inc.
Tiburon, Calif.

[54] FAST RESPONSE DYNAMIC GAIN CONTROL CIRCUIT

4 Claims, 1 Drawing Fig.

[52] U.S. Cl. .......... 330/29, 330/86
[51] Int. Cl. .......... H03g 3/30
[50] Field of Search .......... 330/28, 29, 35, 38 (FE), 86, 108, 138, 141; 325/319, 413

[56] References Cited

UNITED STATES PATENTS

| | | | |
|---|---|---|---|
| 3,229,218 | 1/1966 | Sickles et al. | 330/145X |
| 3,248,642 | 4/1966 | Rothschild | 330/86X |
| 3,267,388 | 8/1966 | Finkey et al. | 330/141X |
| 3,271,694 | 9/1966 | Brown | 320/29X |
| 3,382,461 | 5/1968 | Wolcott | 330/29X |

OTHER REFERENCES

Pawluk " FET Levels Wien Bridge Oscillator Output" , The Electronic Engineer, October 1967, pp. 32, 33, 330-29

*Primary Examiner*—Roy Lake
*Assistant Examiner*—James B. Mullins
*Attorney*—Flehr, Hohbach, Test, Albritton and Herbert

ABSTRACT: A dynamic gain control circuit for audio frequencies includes an audio amplifier of the operational type having an inverse feedback network including a threshold level sensing network providing a control voltage when the amplified output signal exceeds a predetermined level. The control voltage is coupled to the input of an insulated gate field effect transistor whose impedance is varied to control the amplification of the operational amplifier.

PATENTED MAY 25 1971 3,581,223
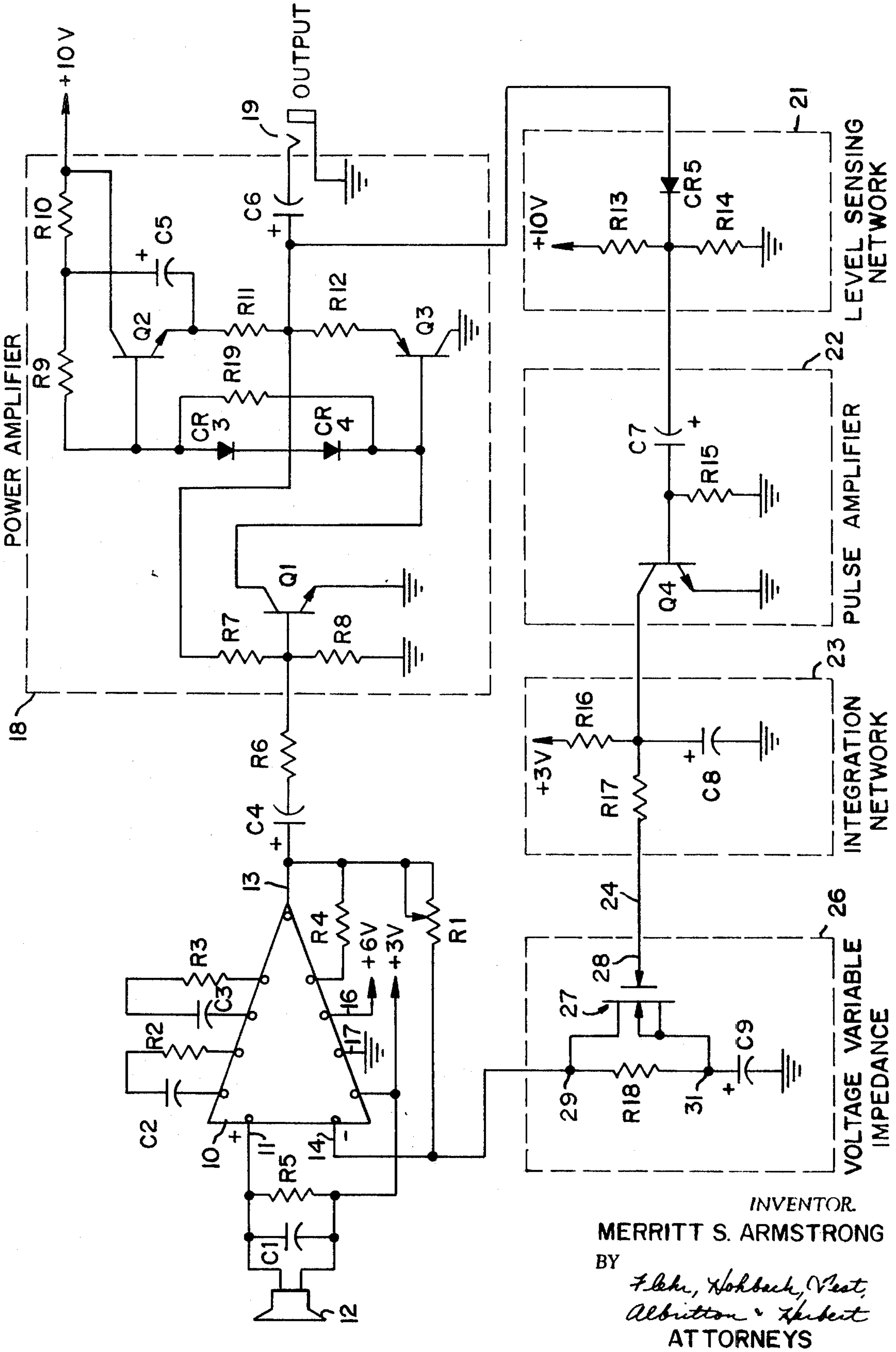
*INVENTOR.*
MERRITT S. ARMSTRONG
BY
*Fleher, Hohbach, Test, Albritton & Herbert*
ATTORNEYS

FAST RESPONSE DYNAMIC GAIN CONTROL CIRCUIT

BACKGROUND OF THE INVENTION

The present invention relates in general to a fast response dynamic gain control circuit and more particularly to a circuit for use at audio frequencies.

Prior automatic gain control circuits derive a DC control voltage from the output signal of an amplifier and couple this control voltage to an input to control the gain of the amplifier directly. This produces nonlinearities in the gain of the amplifier. Where the control voltage is used to charge a capacitor the attack and recovery time of the gain control circuit is worsened. This is usually referred to as overshoot and undershoot.

The above defects in gain control circuits produce effects such as "blasting" where an unusually high amplitude burst of noise or signal is not limited quickly enough and other annoying noises such as clicks and thumps.

OBJECTS AND SUMMARY OF THE INVENTION

It is a general object of the present invention to provide an improved dynamic gain control circuit.

It is another object to provide a circuit as above which does not deleteriously affect the associated amplifier.

It is another object of the invention to provide a circuit as above which eliminates undesirable effects such as blasting, clicks and thumps.

In accordance with the above objects there is provided a fast response dynamic gain control circuit comprising operational amplifier means having a first signal input, a second signal input, and an output. The first signal input is adapted for coupling to an audio frequency signal which is amplified by the amplifier means and coupled to the output. The second signal input is responsive to an applied control signal for varying the amplification of the amplifier means. Feedback means responsive to the amplifier audio signal exceeding a predetermined threshold level are provided for varying the control signal to adjust the amplification in proportion to the amount the amplified audio signal exceeds the threshold level. The feedback means includes threshold level sensing means coupled to the output for providing the threshold level and for producing a control voltage proportional to the amount the amplified audio signal exceeds the threshold level. The feedback means also includes insulated gate field effect transistor means having a gate input coupled to the threshold level sensing means and an output terminal coupled to the second signal input for varying the control signal in response to variations in the control voltage.

BRIEF DESCRIPTION OF THE DRAWING

The single drawing is a circuit schematic of a fast response dynamic gain control circuit embodying the present invention.

DETAILED DESCRIPTION OF THE PREFERRED EMBODIMENT

Referring to the drawing, an operational amplifier 10 includes a first signal input 11 labeled with a positive polarity sign which is adapted for coupling to an audio frequency signal through a microphone 12. A radio frequency bypass capacitor C1 is coupled across the microphone 12 along with a resistor R5 which has one terminal coupled to the signal input 11 and the other terminal coupled to the operational amplifier 10 and a common positive 3-volt regulated power supply (not shown). Thus the audio energy, for example, from a person speaking, is sensed by microphone 12 and a signal voltage is developed across resistor R5 which is coupled to the first signal input 11 of operational amplifier 10, amplified and produced on an output 13 of the amplifier.

Amplifier 10 also includes an inverting signal input 14 designated with a negative sign which is coupled back to output 13 by a potentiometer R1 which serves as a volume control for the amplifier. The feedback provided by volume control R1 is an inverse type of feedback; in other words, the greater the feedback the greater the decrease of amplification of the amplifier.

Other auxiliary circuits for amplifier 10 include a positive 6-volt regulated power supply coupled on line 16, a common or ground connection 17, a resistor R4 coupled between output 13 and the amplifier which reduces the amplifier sensitivity to variations in its output load impedance, and networks comprising capacitor and resistor C2, R2 and C3, R3 which provide phase compensation for the inverting and noninverting channels of the operational amplifier connected with inputs 14 and 11.

The operational amplifier itself is of standard integrated circuit design and for example may be type CA3029A.

The amplified audio signal voltage is coupled to a power amplifier shown within the dashed block 18 through coupling capacitor C4 and series connected resistor R6. This signal is developed across a resistor R8 which is coupled between the base of transistor Q1 and ground.

The collector of Q1 drives the bases of transistors Q2 and Q3. Bias for Q2 and Q3 along with the collector supply voltage for Q1 is supplied via the network consisting of series connected diodes CR3 and CR4, resistor R19 connected across these diodes and series connected resistors R9 and R10 coupled to a positive 10-volt power source. Capacitor C5 connected between the emitter and base of Q2 through series connected R9 serves as an audio bypass. Resistor R7 coupled between the base of Q1 and between the series connected resistors R11 and R12 which are coupled to the emitters of Q2 and Q3 respectively provide for base bias and negative feedback to Q1. The amplified audio signal output is taken off of an output jack 19 which is coupled through DC isolation capacitor C6 to the emitters of transistors Q2 and Q3 through current limiting resistors R11 and R12.

In accordance with the invention the amplified audio output signal is coupled from the power amplifier 18 through a feedback network to the inverting input 14 of operational amplifier 10 for varying the gain of amplifier 10 in proportion to the amount the amplified audio signal exceeds a predetermined threshold level. The feedback means includes generally threshold level sensing means comprising a level sensing network 21, a pulse amplifier 22 and an integration network 23. The integration network produces a control voltage on line 24 proportional to the amount the amplified audio signal exceeds the threshold level and this is applied to a voltage variable impedance 26.

Such voltage variable impedance includes a metal oxide silicon or insulated gate-type field effect transistor 27 having an input gate terminal 28 and source and drain output terminals 29 and 31. A resistor R18 is coupled across the output terminals 29, 31 to maintain the two output terminals at the same DC potential to thus prevent the field effect transistor 27 from drawing current from any outside source. The output terminal 31 is coupled to ground or common through a DC blocking capacitor C9. The output terminal 29 is coupled to the inverting signal input 14 of amplifier 10. The control voltage on line 24 develops an electrostatic field across the semiconductor channel within the field effect transistor causing a "pinch-off" effect which varies proportionally with the electrostatic field. This pinch-off effect causes the resistance of the channel within the field effect transistor between the source and drain terminals to vary in proportion to the variation of the control signal on line 24. Resistor R18 limits the maximum resistance between the source and drain terminals. Thus, the combination of the field effect transistor 27, resistor R18 and capacitor C9 provides a voltage variable impedance which functions as a voltage divider along with potentiometer R1 to vary a control signal to inverting input 14 to thereby vary the amplification of amplifier 10.

Now referring to the remainder of the feedback network, the level sensing network 21 includes a pair of series connected resistors R13 and R14 having a potential difference applied across them by a positive 10-volt power source coupled to resistor R13 with resistor R14 being coupled to common or ground. A diode CR5 has its cathode terminal coupled between resistors R13 and R14 and its anode terminal coupled to the amplified audio signal voltage present in power amplifier 18 at a point 20 which is the output line of the amplifier. Resistors R13 and R14 back bias the cathode terminal of CR5 to prevent it from conducting until the peak audio signal voltage across the load which is coupled to the output 19 exceeds a predetermined threshold level which is determined primarily by the relative values of R13 and R14. When this peak signal voltage exceeds the threshold level the diode CR5 conducts and couples a voltage to a pulse amplifier 22.

Pulse amplifier 22 includes a transistor Q4 having its base input coupled to a resistor R15 coupled to ground and a series connected capacitor C7. The signal developed from level sensing network 21 is coupled through the capacitor C7 and R15 to Q4 to place it in a conductive condition. Q4 is normally biased into a cutoff condition and therefore does not draw collector current until the threshold level as established by level sensing network 21 has been exceeded by the amplified output audio signal.

The collector output of Q4 is coupled to integration network 23 which includes the capacitor C8 coupled to ground and a series connected resistor R16 coupled to a positive 3-volt power source. The voltage source normally charges capacitor C8 while Q4 is in an off condition. Resistor R17 is coupled between R16 and C8 and provides a control voltage on line 24 to the gate input 28 of field effect transistor 27. Conduction of transistor Q4 causes a discharging of the capacitor C8 in proportion to the average of the amount the amplified audio signal exceeds the threshold level. Thus, the integration network 23 provides a type of smoothing action.

In operation, the present invention finds special use in auditory training for children or adults with impaired hearing. As discussed above, with a device of this type sudden bursts of noise or high speech levels normally would cause great annoyance to the user of the device. The effects of this are termed blasting. In addition even with gain control such effects as clicks and thumps and extraneous signals may still be introduced. With the present invention when an unusually large input signal is received by microphone 12 and amplified by the amplifier 10 (which serves in effect as the preamplifier) and power amplifier 18, the amplitude of such signal is sensed at point 20 by the feedback network and the level sensing network 21 almost instantaneously produces a voltage which activates transistor Q4 of pulse amplifier 22. This causes the discharge of capacitor C8 of integration network 23 to provide the control voltage on line 24 to vary or reduce the impedance of voltage variable impedance 26 or more specifically the metal oxide silicon-type field effect transistor 27. This has the effect of increasing the control signal to inverting input 14 to thereby correspondingly reduce the amplification of amplifier 10 to eliminate the undesired large audio amplified signal at output 19. Such output would normally be coupled to either a headset worn by the auditory trainee or to hearing aid type receptacles fitted in the ear.

The dynamic gain control circuit as in the present invention accommodates an increase in the input signal strength at microphone 12 as much as 40 decibels with a resulting output at output 19 of less than 0.5 decibels. However, this dynamic control effect is not active until the output signal amplitude signal has, for example, reached the level of approximately 0.5 decibels below the desired maximum amplifier output. Thus, weak signals can be amplified to nearly full output level before the dynamic gain control starts to reduce the gain of the amplifier 10. Therefore, the present invention provides a substantially constant audio output level at output 19 regardless of the input of relatively weak signal strength or very high signal strength which would normally "blast" the user.

Moreover, since the novel feedback circuit for dynamic gain control uses an insulated gate field effect transistor, the linearity of amplification is not affected. In addition, the fast response provided by the feedback network eliminates effects such as overshoot and undershoot. The fact that the feedback network and more particularly the voltage variable impedance 26 which includes metal oxide silicon field effect transistor 27 does not affect the amplifier 10 allows the signal to noise ratio of the amplifying circuit to be maintained constant, prevents any increase of internally generated noise, and also causes no decrease in the bandwidth of the amplifier.

Thus, an improved dynamic gain control circuit has been provided which has a fast response time, does not deleteriously affect the associated audio amplifying circuits and eliminates undesirable side effects such as blasting, clicks and thumps.

I claim:

1. A fast response dynamic gain control circuit for an audio frequency amplification system comprising operational audio amplifier means having a first signal input, a second signal input, a predetermined maximum output level and an output said first signal input being adapted for coupling to an audio frequency signal which is amplified by said amplifier means and coupled to said output, said second signal input being responsive to an applied feedback signal for varying the amplification of said amplifier means, and control means responsive to said amplified audio signal exceeding a predetermined threshold level for varying said feedback signal to adjust said amplification in proportion to the amount said amplified audio signal exceeds said threshold level, said control means including threshold level sensing means coupled to said output for providing said threshold level at a level slightly below said maximum output level and for producing a control voltage proportional to the amount said amplified audio signal exceeds such threshold level, said control means also including insulated gate field effect transistor means having a gate input coupled to said threshold level sensing means and an output terminal coupled to said second signal input for varying said feedback signal in response to variations in said control voltage said gain control circuit also including variable resistor means coupled between said output and said second input of said operational amplifier means for producing said feedback signal for varying the gain of said amplifier, said field effect transistor means serving as a voltage variable impedance to also vary said feedback signal.

2. A fast response dynamic gain control circuit as in claim 1 where said second signal input is an inverting type input.

3. A fast response dynamic gain control circuit for an audio frequency amplification system comprising operational audio amplifier means having a first signal input, a second signal input, a predetermined maximum output level and an output said first signal input being adapted for coupling to an audio frequency signal which is amplified by said amplifier means and coupled to said output, said second signal input being responsive to an applied feedback signal for varying the amplification of said amplifier means, and control means responsive to said amplified audio signal exceeding a predetermined threshold level for varying said feedback signal to adjust said amplification in proportion to the amount said amplified audio signal exceeds said threshold level, said control means including threshold level sensing means coupled to said output for providing said threshold level at a level slightly below said maximum output level and for producing a control voltage proportional to the amount said amplified audio signal exceeds said threshold level said threshold level sensing means including a level sensing network coupled to said output and integration means coupled to said level sensing network said integration means providing said control voltage and transistor amplifier means coupling said level sensing network to said integration means, said transistor means being in a conductive condition in response to said amplified audio signal exceeding said threshold level, said control means also including insulated gate field effect transistor means having a gate input coupled to said threshold level sensing means and an output terminal coupled to said second signal input for varying said feedback signal in response to variations in said control voltage.

4. A fast response dynamic gain control circuit as in claim 3 in which said integration means includes a capacitor, series connected resistor and a voltage source coupled across said capacitor and resistor for charging said capacitor, said transistor means being coupled across said capacitor said conduction of said transistor means discharging said capacitor in proportion to the average of the amount said amplified audio signal exceeds said threshold level.